US010241607B2

(12) United States Patent
Leng

(10) Patent No.: US 10,241,607 B2
(45) Date of Patent: Mar. 26, 2019

(54) DISPLAY SUBSTRATE, DISPLAY PANEL AND DISPLAY DEVICE

(71) Applicant: Shanghai Tianma Micro-Electronics Co., Ltd., Shanghai (CN)

(72) Inventor: Chuanli Leng, Shanghai (CN)

(73) Assignee: SHANGHAI TIANMA MICRO-ELECTRONICS CO., LTD., Shanghai (CN)

(*) Notice: Subject to any disclaimer, the term of this patent is extended or adjusted under 35 U.S.C. 154(b) by 0 days.

(21) Appl. No.: 15/866,335

(22) Filed: Jan. 9, 2018

(65) Prior Publication Data
US 2018/0129332 A1 May 10, 2018

(30) Foreign Application Priority Data

Jun. 30, 2017 (CN) .......................... 2017 1 0524242

(51) Int. Cl.
G06F 3/041 (2006.01)
G01L 1/22 (2006.01)
G09G 3/20 (2006.01)
H01L 27/12 (2006.01)
H01L 29/786 (2006.01)
G01L 1/18 (2006.01)
G06F 1/3234 (2019.01)

(52) U.S. Cl.
CPC .............. G06F 3/0414 (2013.01); G01L 1/18 (2013.01); G01L 1/2262 (2013.01); G01L 1/2293 (2013.01); G06F 1/3262 (2013.01); G06F 3/0416 (2013.01); G09G 3/2085 (2013.01); H01L 27/124 (2013.01); H01L 27/1222 (2013.01); H01L 27/1255 (2013.01); H01L 29/78666 (2013.01); H01L 29/78675 (2013.01); G09G 2310/0286 (2013.01); G09G 2330/12 (2013.01)

(58) Field of Classification Search
CPC .... G06F 3/0414; G06F 1/3262; G06F 3/0416; H01L 29/78666; H01L 29/78675; H01L 27/1222; H01L 27/124; H01L 27/1255; G09G 2330/12; G09G 2310/0286; G09G 3/2085; G01L 1/2262; G01L 1/18; G01L 1/2293
See application file for complete search history.

(56) References Cited

U.S. PATENT DOCUMENTS

2017/0185211 A1* 6/2017 Lu .......................... G06F 3/0412
2018/0300012 A1* 10/2018 Lu .......................... G06F 3/0416

* cited by examiner

Primary Examiner — Abhishek Sarma
(74) Attorney, Agent, or Firm — Alston & Bird LLP

(57) ABSTRACT

Provided are a display substrate, a display panel and a display device, among them, the display substrate includes a base substrate and at least a semiconductor pressure sensor disposed in the display substrate; the semiconductor pressure sensor includes a first connection terminal, a second connection terminal, a third connection terminal and a fourth connection terminal, the first and second connection terminals are used to receive the bias voltage signal, the third and fourth connection terminals are used to output the strain voltage signal; the control electrode arranged at a side of the semiconductor pressure sensor is configured to be insulated with the semiconductor pressure sensor and used to control the semiconductor pressure to be turned on and to be turned off; a control signal line is connected to the control electrode.

20 Claims, 10 Drawing Sheets

DISPLAY SUBSTRATE, DISPLAY PANEL AND DISPLAY DEVICE

CROSS-REFERENCE TO RELATED APPLICATIONS

This application claims priority to a Chinese patent Application No. CN201710524242.4 Filed on Jun. 30, 2017, the disclosure of which is incorporated herein by reference in its entirety.

TECHNICAL FIELD

The present disclosure relates to touch technologies, and in particular relates to a display substrate, a display panel and a display device.

BACKGROUND

At present, more and more electronic devices are provided with touch screens, such as kiosks in public places, computers and mobile phones used by the users in daily life. The users may perform the operations on the electronic devices by merely touching the icons on the touch screens using their fingers, thereby avoiding the operations by keyboards and mouses, which makes a human-machine interaction easier. In order to better meet the requirements from the users, a pressure sensor is commonly arranged in the touch screens to detect the magnitude of the touch pressure during the touch operation by the users.

Bridge-type strain sensor is a kind of pressure sensor which may be used to detect the magnitude of the touch pressure. The bridge-type strain sensor may calculate the magnitude of the touch pressure by measuring a change in the resistance in the sensor through the detection of the internal deformation caused by the strain in the z direction.

In the related technologies, due to lack of the switching function in the bridge-type strain sensor, when the bridge-type strain sensor is integrated into the display panel, it maintains a conducting state in any time, leading to a high power consumption.

SUMMARY

In view of the above, embodiments of the present disclosure provide a display substrate, a display panel and a display device in order to solve the problem in the prior art that, the bridge-type strain sensor has the high power consumption since the sensor maintains the conducting state in any time due to lack of the switching function.

On the first aspect, the embodiments of the present disclosure provide a display substrate. The display substrate includes a base substrate and at least a semiconductor pressure sensor disposed in the display substrate.

The semiconductor pressure sensor includes a first connection terminal, a second connection terminal, a third connection terminal and a fourth connection terminal. The first and second connection terminals are used to receive the bias voltage signal and the third and fourth connection terminals are used to output the strain voltage signal. A first line between the first and the second connection terminals is intersected with a second line between the third and the fourth connection terminals.

A control electrode disposed at a side of the semiconductor pressure sensor is configured to be insulated with the semiconductor pressure sensor. The vertical projection of the control electrode on the plane where the semiconductor pressure sensor lied is overlapped with the semiconductor pressure sensor, and the control electrode is configured to control the pressure sensor to be turned on and turned off.

A control signal line is connected to the control electrode.

On the second aspect, the embodiments of the present disclosure has further provided a display panel including the display substrate mentioned above, and further including an opposing substrate opposite to the display substrate.

Moreover, the embodiments of the present disclosure have further provided a display device including the display panel mentioned above.

The present disclosure has provided a display substrate, a display panel and a display device, including at least a semiconductor pressure sensor and a control electrode disposed at a side the semiconductor pressure sensor, the semiconductor pressure sensor includes a first connection terminal, a second connection terminal, a third connection terminal and a fourth connection terminal, the first and second connection terminals are used to receive the bias voltage signal, the third and fourth connection terminals are used to output the strain voltage signal, when the pressure detection is performed by the semiconductor pressure sensor, and the semiconductor pressure sensor has a small size and advantages on the high strain voltage and automatic temperature compensation; meanwhile, the control electrode is to control the semiconductor pressure to be turned on and turned off, and achieving the switching function of the semiconductor pressure sensor, the control method is simple and easy to implement, during the non-pressure detection stage, the semiconductor sensor may be turned off and achieve a reduced power consumption of the product.

BRIEF DESCRIPTION OF DRAWINGS

In order to describe the technical solution in the present disclosure, a brief description for the drawings which employed in the detailed description will be given as follows. Apparently, the drawings introduced herein are merely a part of the embodiments of the present disclosure and not all the drawings. For those skilled in the art, other drawings may be obtained according to the attached drawings without creative work.

DETAILED DESCRIPTION

In order to make the objects, technical solution and advantages of the present disclosure more clear, the present disclosure is further described below in combination with the drawings, through the specific embodiments and the technical solution of the present disclosure is fully described. Apparently, the embodiments stated herein are merely a part of structures related to the present disclosure rather than the whole structure, other embodiments achieved by the person skilled in the art without creative works may fall into the scope of protection in the present disclosure.

Figure 1:
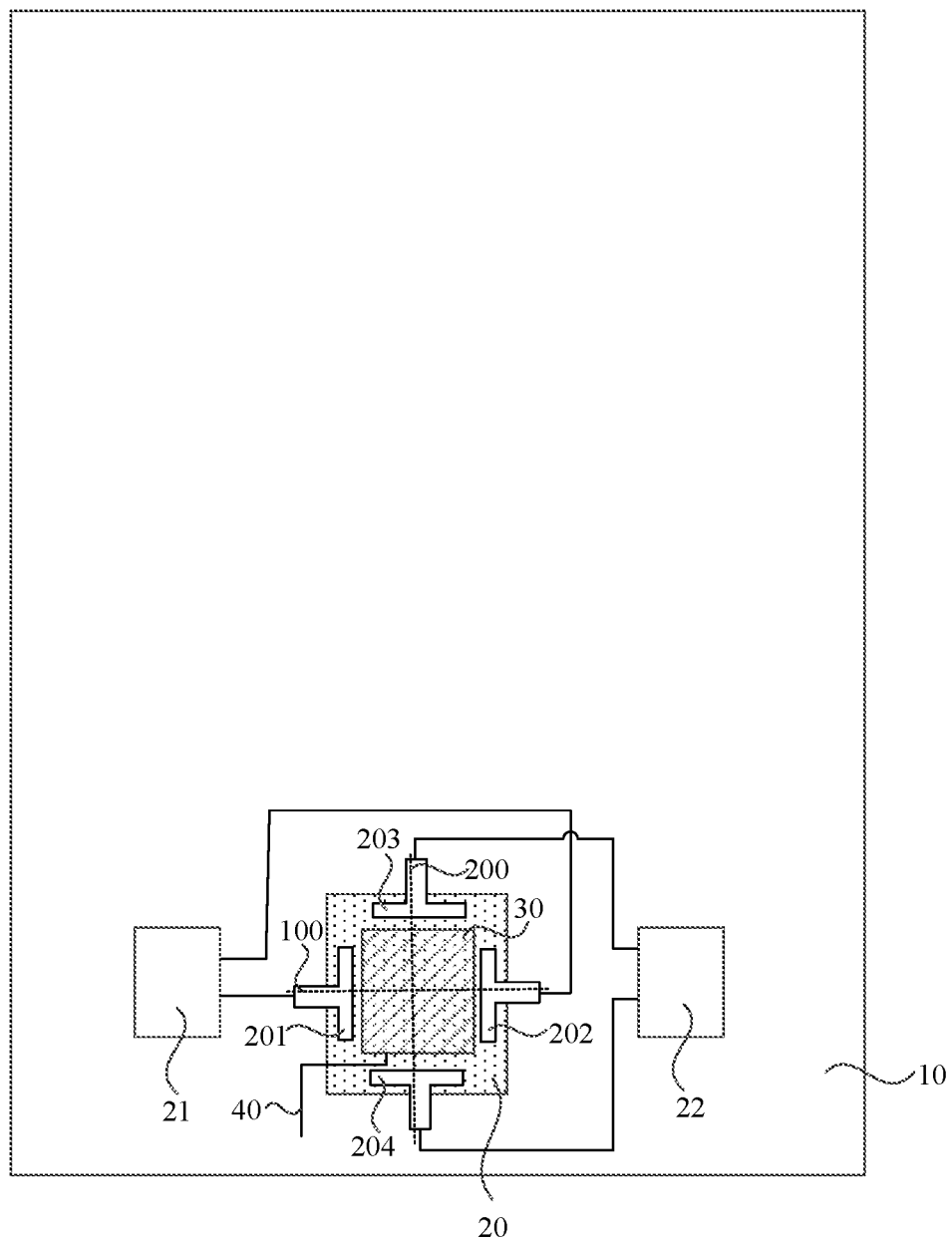
FIG. 1 is a structural diagram showing a display substrate according to an embodiment of the present disclosure.

FIG. 1 is a structural diagram showing a display substrate according to an embodiment of the present disclosure. Referring to FIG. 1, the display substrate provided by this embodiment of the present disclosure may include: a base substrate 10 and at least a semiconductor pressure sensor 20; the semiconductor pressure sensor 20 may include the first connection terminal 201, second connection terminal 202, third connection terminal 203 and fourth connection terminal 204. The first connection terminal 201 and second connection terminal 202 are configured to receive a bias voltage signal, and the third connection terminal 203 and fourth connection terminal 204 are configured to output a strain voltage signal. The first line 100 between the first connection terminal 201 and the second connection terminal 202 is intersected with the second line 200 between the third connection terminal 203 and the fourth connection terminal 204. A control electrode 30 is disposed at the side of the semiconductor pressure sensor 20, and the control electrode 30 is provided to be insulated with the semiconductor pressure sensor 20. The vertical projection of the control electrode 30 on the plane of the semiconductor pressure sensor 20 is overlapped with the semiconductor pressure sensor 20 to form an overlapped region. The control electrode 30 is used to control turning-on and turning-off of the semiconductor pressure sensor 20. A control signal line 40 is connected to the control electrode 30.

Exemplarily, the semiconductor pressure sensor 20 may be a diffused silicon piezoresistive pressure sensor. For example, the semiconductor pressure sensor 20 may be an amorphous silicon film or a polysilicon film. Optionally, the semiconductor pressure sensor 20 may be a four-terminal diffused silicon piezoresistive pressure sensor, which is formed by forming and then packaging the resistance strain sheet on a silicon slice using the ion injecting process. Such the semiconductor pressure sensor 20 has several advantages such as high output, small size and automatic temperature compensation, and is easy to be integrated in the display substrate. FIG. 1 is a structural diagram showing a display substrate according to an embodiment of the present disclosure. Referring to FIG. 1, at least a semiconductor pressure sensor 20 is arranged at a side of the base substrate 10, the first and second connection terminals 201, 202 are configured to input the bias voltage signal, the third and fourth connection terminals 203, 204 are configured to output the strain voltage signal output. When the finger touches the display substrate, the entire display substrate is deformed, and hence the resistance in the resistance strain sheet changes, that is, the resistances of the first connection terminal 201, the second connection terminal 202, the third connection terminal 203 and the fourth connection terminal 204 change, thereby leading to the change in the strain voltage signals outputted from the third and fourth connection terminals 203, 204. Therefore, the strain voltage of the semiconductor pressure sensor 20 may be obtained by detecting the strain voltage signals outputted from the third and fourth connection terminals 203, 204, thereby determining the magnitude of the touch pressure when the finger touches the display substrate.

Since there is no a switching function in the semiconductor pressure sensor 20, the semiconductor pressure sensor 20 maintains at the conducting state at any time, regardless of whether it is in a pressure detecting stage, a normal display stage or a touch position detecting stage, and a plurality of the signal lines connected to the semiconductor pressure sensor 20 also maintains at working mode at any time, so that the plurality of the signal lines connected to the semiconductor pressure sensor 20 cannot be connected to other devices to achieve a reuse function. Furthermore, the plurality of the signal lines connected to the semiconductor pressure sensor 20 which still maintains at the working mode at any time also leads to a high power consumption. Therefore, the display substrate provided by the embodiment of the present disclosure further includes a control electrode 30. Referring to FIG. 1, the control electrode 30 is arranged at the side of the semiconductor pressure sensor 20. The control electrode 30 are configured to be insulated with the semiconductor pressure sensor 20, and the vertical projection of the control electrode 30 on the plane of the semiconductor pressure sensor 20 is overlapped with the semiconductor pressure sensor 20. The control electrode 30 may be a switching device for the semiconductor pressure sensor 20 and used to control turning-on and turning-off of the semiconductor pressure sensor 20; Exemplarily, the control electrode 30 is used to control turning-on and turning-off of the semiconductor pressure sensor 20, and the operating principle thereof may be similar to the principle that the gate electrode in the thin film transistor may be used to control turning-on and turning-off of the channel region in the active layer of the thin film transistor. The control electrode 30 may be similar to the gate electrode of the thin film transistor, the overlapped region between the vertical projection of the control electrode 30 on the plane of the semiconductor pressure sensor 20 and the semiconductor pressure sensor 20 may be similar to the channel region. When the magnitude of the control signal inputted via the control signal lines 40 connected to the control electrode 30 to the control electrode 30 is larger than a certain value, for example the magnitude of the control signal is larger than a conduction threshold, the control electrode 30 controls the semiconductor pressure sensor 20 to be turned on. At this time, the semiconductor pressure sensor 20 is in working mode and hence can detect the pressure operation. Otherwise, when the magnitude of the control signal inputted via the control signal lines 40 connected to the control electrode 30 to the control electrode 30 is less than a certain value, for example the magnitude of the control signal is less than the conduction threshold, the control electrode 30 controls the semiconductor pressure sensor 20 to be turned off, and hence the semiconductor pressure sensor 20 is in off state and stops detecting the pressure operation. At this time, the semiconductor pressure sensor 20 may be connected to other devices to perform a reuse function, thereby reducing the number of the signal lines in the display substrate; or the signal lines connected to the semiconductor pressure sensor 20 is in non-working mode, thereby reducing the power consumption of the display substrate and ensuring a low power consumption for the display substrate.

In summary, the display substrate provided by this embodiment of the present disclosure, includes at least a semiconductor pressure sensor and a control electrode disposed at a side thereof. The semiconductor pressure sensor can achieve the pressure detection to have a high detection sensitivity. The semiconductor pressure sensor is easily controlled to be turned on and turned off by the control electrode, so that the signal lines may be reused, thereby achieving the narrow frame of the display substrate, reducing the power consumption of the display substrate and prolonging the life of the display substrate.

Optionally, the control electrode 30 may be a metallic electrode. For example, the material of the control electrode 30 may be one or more of the metals comprising Ni, Pt, Pb and Au. By inputting the control signal via the control signal line 40 to the control electrode 30, turning-on and turning-off of the semiconductor pressure sensor may be controlled.

Optionally, the display substrate provided by the present disclosure further includes a bias voltage applying circuit 21 and a voltage detection circuit 22. Referring to FIG. 1 again, the bias voltage applying circuit 21 is electrically connected to the first and second connection terminals 201, 202 of the semiconductor pressure sensor 20, in order to provide the bias voltage signal to the semiconductor pressure sensor 20; the voltage detection circuit 22 is electrically connected to the third and fourth connection terminals 203, 204 of the semiconductor pressure sensor 20, in order to receive the strain voltage signal from the semiconductor pressure sensor 20. Optionally, the bias voltage applying circuit 21 may include the first and second electrodes (not shown), the first electrode is electrically connected to the first connection terminal 201, and the second electrode is electrically connected to the second connection terminal 202. The voltage detection circuit 22 may include the third and fourth electrodes (not shown), the third electrode is electrically connected to the third connection terminal 203, and the fourth electrode is electrically connected to the fourth connection terminal 204. The first and second electrodes are used to apply a bias voltage to the semiconductor pressure sensor 20, and the third and fourth electrodes are used to obtain a strain voltage from the semiconductor pressure sensor 20.

Optionally, the first line 100 between the first and second connection terminals 201, 202 is intersected with the second line 200 between the third and fourth connection terminals 203, 204. Specifically the first line 100 may be intersected orthogonally with the second line 200. Referring to FIG. 1, during detection of the touch pressure, the strain in the direction of the first line is sensed by the first and second connection terminals 201, 202, the strain in the direction of the second line is sensed by the third and fourth connection terminals 203, 204. Therefore, the first, second, third and fourth connection terminals 201, 202, 203, 204 may be distributed in the same place or relative small areas, so that the first, second, third and fourth connection terminals 201, 202, 203, 204 have a synchronous temperature change, thereby eliminating the effect of the temperature difference, sensing the deformation in the display substrate and improving the pressure sensitivity.

Optionally, the semiconductor pressure sensor 20 may be a polygon structure with at least four sides. The first, second, third and fourth connection terminals 201, 202, 203, 204 are disposed in the areas of the polygon structure close to the four sides, respectively. The vertical projection of the control electrode 30 on the plane of the semiconductor pressure sensor 20 is overlapped with the part of the semiconductor pressure sensor 20 other than the first, second, third and fourth connection terminals 201, 202, 203, 204 to form an overlapped region. Referring to FIG. 1, FIG. 1 merely gives an exemplary description for the shape of the rectangle semiconductor pressure sensor. As shown in FIG. 1, the shape of the semiconductor pressure sensor may be a rectangle, and the first, second, third and fourth connection terminals 201, 202, 203, 204 are disposed in the areas of the rectangle semiconductor pressure sensor 20 close to the four sides. The shape of the control electrode 30 may also be rectangle, and the vertical projection of the control electrode 30 on the plane of the semiconductor pressure sensor 20 is overlapped with the central region of the semiconductor pressure sensor 20 to form an overlapped region. That is, the vertical projection of the control electrode 30 on the plane of the semiconductor pressure sensor 20 is overlapped with the part of the semiconductor pressure sensor 20 other than the first, second, third and fourth connection terminals 201, 202, 203, 204 to form an overlapped region.

Figure 2:
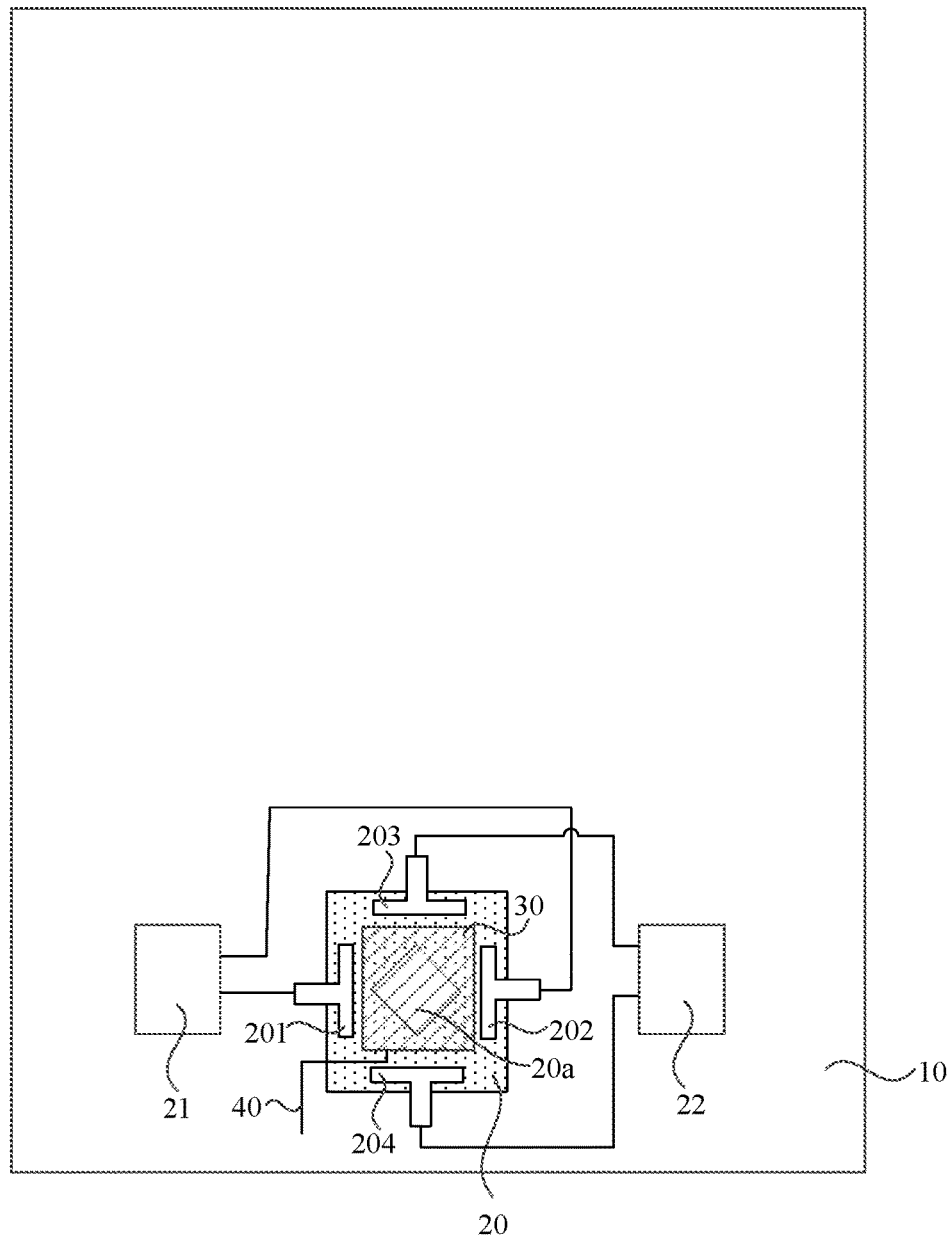
FIG. 2 is a structural diagram showing another display substrate according to an embodiment of the present disclosure.

Optionally, FIG. 2 is a structural diagram showing another display substrate according to an embodiment of the present disclosure. The difference between the display substrates in FIG. 1 and FIG. 2 is that the semiconductor pressure sensor 20 includes a hollow zone. As shown in FIG. 2, a hollow zone 20a is located in the overlapped region of the vertical projection of the control electrode 30 on the plane of the semiconductor pressure sensor 20 with the semiconductor pressure sensor 20. The hollow zone 20a may be disposed in the central region or the edge region of the semiconductor pressure sensor 20, which is not limited in the embodiments of the present disclosure. Optionally, the shape of the hollow zone 20a may be one of a rectangle, a rhombus, a circular or a triangle, which is also not limited in the embodiments of the present disclosure. FIG. 2 merely gives an exemplary description that the hollow zone 20a is arranged in the central region of the semiconductor pressure sensor 20 and the shape of the hollow zone 20a is rhombus. As shown in FIG. 2, the shape of the semiconductor pressure sensor may be a rectangle, and the first, second, third and fourth connection terminals 201, 202, 203, 204 are disposed respectively in the position of the rectangle semiconductor pressure sensor 20 close to the four sides, the shape of the control electrode 30 may also be a rectangle, and the vertical projection of the control electrode 30 on the plane of the semiconductor pressure sensor 20 is overlapped with the central region of the semiconductor pressure sensor 20, and the vertical projection of the control electrode 30 on the plane of the semiconductor pressure sensor 20 covers the hollow zone 20a of the semiconductor pressure sensor 20. It should be understood, by forming a hollow zone 20a in the semiconductor pressure sensor 20, the on-resistance of the semiconductor pressure sensor 20 may be increased, so that in the case that the voltage is disturbed to the semiconductor pressure sensor 20 and signal lines, the semiconductor pressure sensor 20 can obtain the larger disturbed voltage, thereby ensuring a more sensitive detection on the touch pressure. Furthermore, the signal lines get less disturbed voltage, thereby reducing the power consumption caused by the signal lines.

Figure 3:
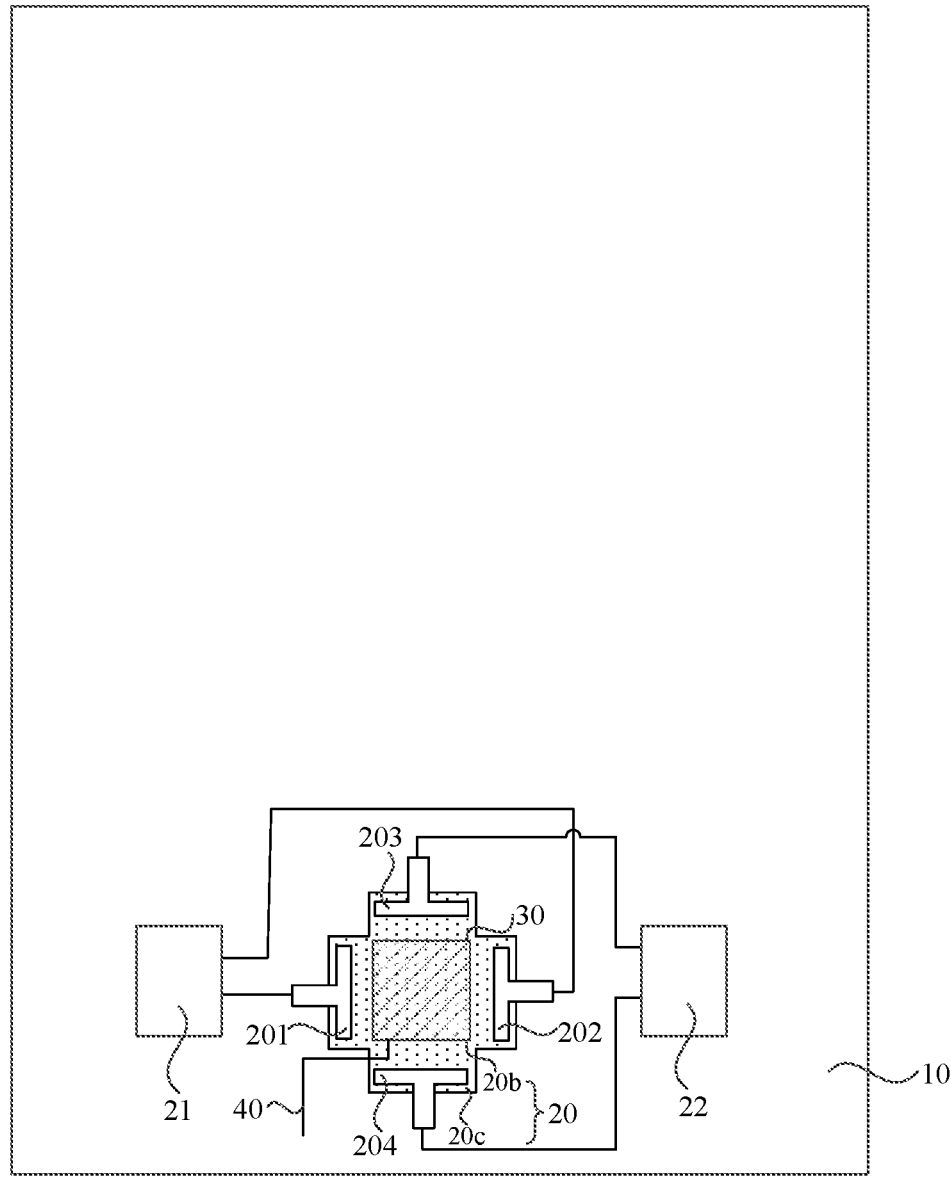
FIG. 3 is a structural diagram showing another display substrate according to an embodiment of the present disclosure.

Optionally, FIG. 3 is a structural diagram showing another display substrate according to an embodiment of the present disclosure. The difference between the display substrate in FIG. 3 and the above mentioned embodiments is the shape of the semiconductor pressure sensor 20. As shown in FIG. 3, the semiconductor pressure sensor 30 may include a body portion 20b of a polygon structure with at least four sides and at least four protrusions 20c connected with the body portion 20b. The first, second, third and fourth connection terminals 201, 202, 203, 204 are disposed on the protrusions 20c respectively; the vertical projection of the control electrode 30 on the plane of the semiconductor pressure sensor 20 is overlapped with the body portion 20b. Optionally, the shape of the body portion 20b may be a quadrangle, and the shape of the control electrode may also be a quadrangle. FIG. 3 merely gives an exemplary description that the shape of the body portion 20b and control electrode 30 are a rectangle. Exemplarily, the control electrode 30 controls turning on and turning off of the body portion 20b which is insulated arranged and has an overlapped region with the control electrode 30, thereby controlling turning on and turning off of the semiconductor pressure sensor 20.

Figure 4:
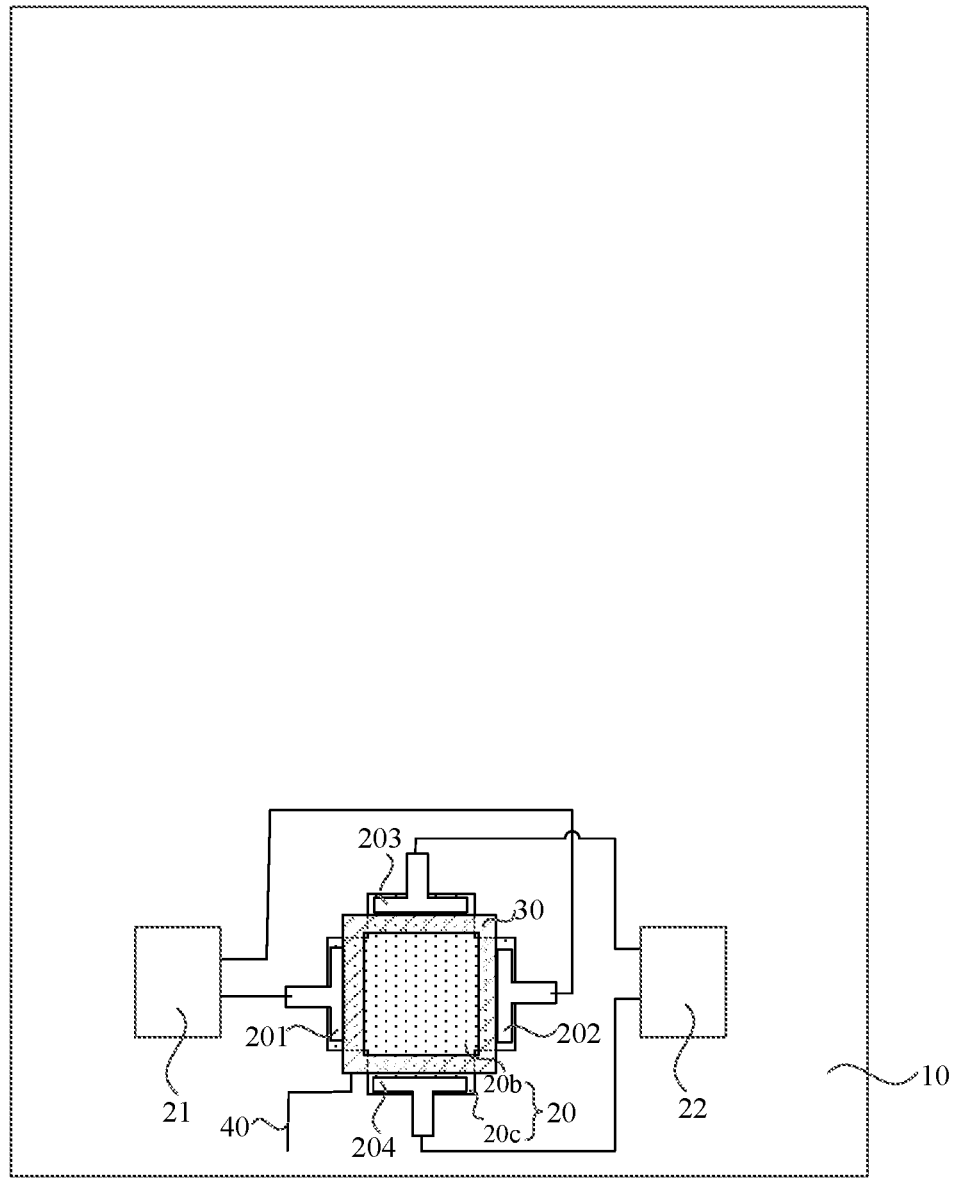
FIG. 4 is a structural diagram showing another display substrate according to an embodiment of the present disclosure.

Optionally, FIG. 4 is a structural diagram showing another display substrate according to an embodiment of the present disclosure, the difference between the display substrate shown in FIG. 4 and above mentioned embodiments is the shape of the semiconductor pressure sensor 30. As shown in FIG. 4, the semiconductor pressure sensor 30 may include a body portion 20b of a polygon structure with at least four sides and at least four protrusions 20c connected with the body portion 20b. The first, second, third and fourth connection terminals 201, 202, 203, 204 are disposed on the protrusions 20c, respectively; the vertical projection of the control electrode 30 on the plane of the semiconductor pressure sensor 20 is overlapped with protrusions 20c to from an overlapped region. Optionally, the shape of the body portion 20b may be a quadrangle, and the shape of the control electrode may be an annular. FIG. 4 merely gives an exemplary description that the shape of the body portion 20b and control electrode 30 each are a rectangle. Exemplarily, the control electrode 30 controls turning on and turning off of the protrusions 20c which is insulated arranged and has an overlapped region with the control electrode 30, thereby controlling turning on and turning off of the semiconductor pressure sensor 20.

Figure 5:
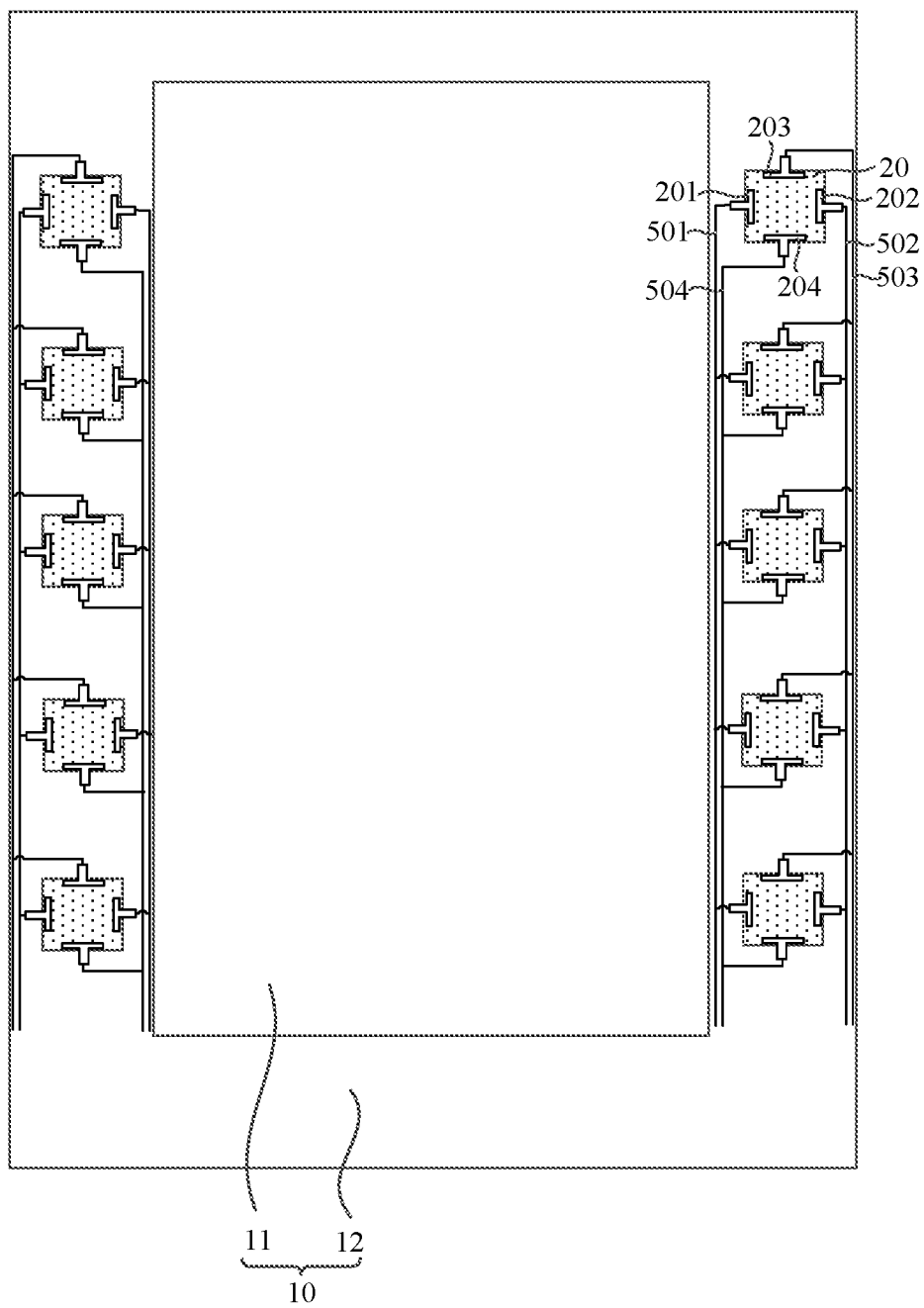
FIG. 5 is a structural diagram showing another display substrate according to an embodiment of the present disclosure.

Optionally, FIG. 5 is a structural diagram showing another display substrate according to an embodiment of the present disclosure. As shown in FIG. 5, the display substrate may include the display region 11 and non-display region 12 surrounding the display region 11, at least a semiconductor pressure sensor 20 may be arranged in the non-display region 12, to ensure that the opening ratio of the display substrate is not affected by the semiconductor pressure sensor 20.

Optionally, the display substrate may further include a plurality of semiconductor pressure sensors 20 which are arranged in the non-display region 12 and arranged in a column in both sides of the display region. Referring to FIG. 5, at the column of the semiconductor pressure sensors 20 in each side of the display region, the first connection terminals 201 are electrically connected to a first signal line 501, the second connection terminals 202 are electrically connected to a second signal line 502, the third connection terminals 203 are electrically connected to a third signal line 503, and the fourth connection terminals 204 are electrically connected to a fourth signal line 504. Therefore, for a plurality of the semiconductor pressure sensors 20 arranged in a column, one signal line is connected with each of certain connection terminals of the semiconductor pressure sensors 20 so that not only a simple design can be achieved but also the number of the signal lines are reduced, thereby easily achieving a narrow frame.

Figure 6:
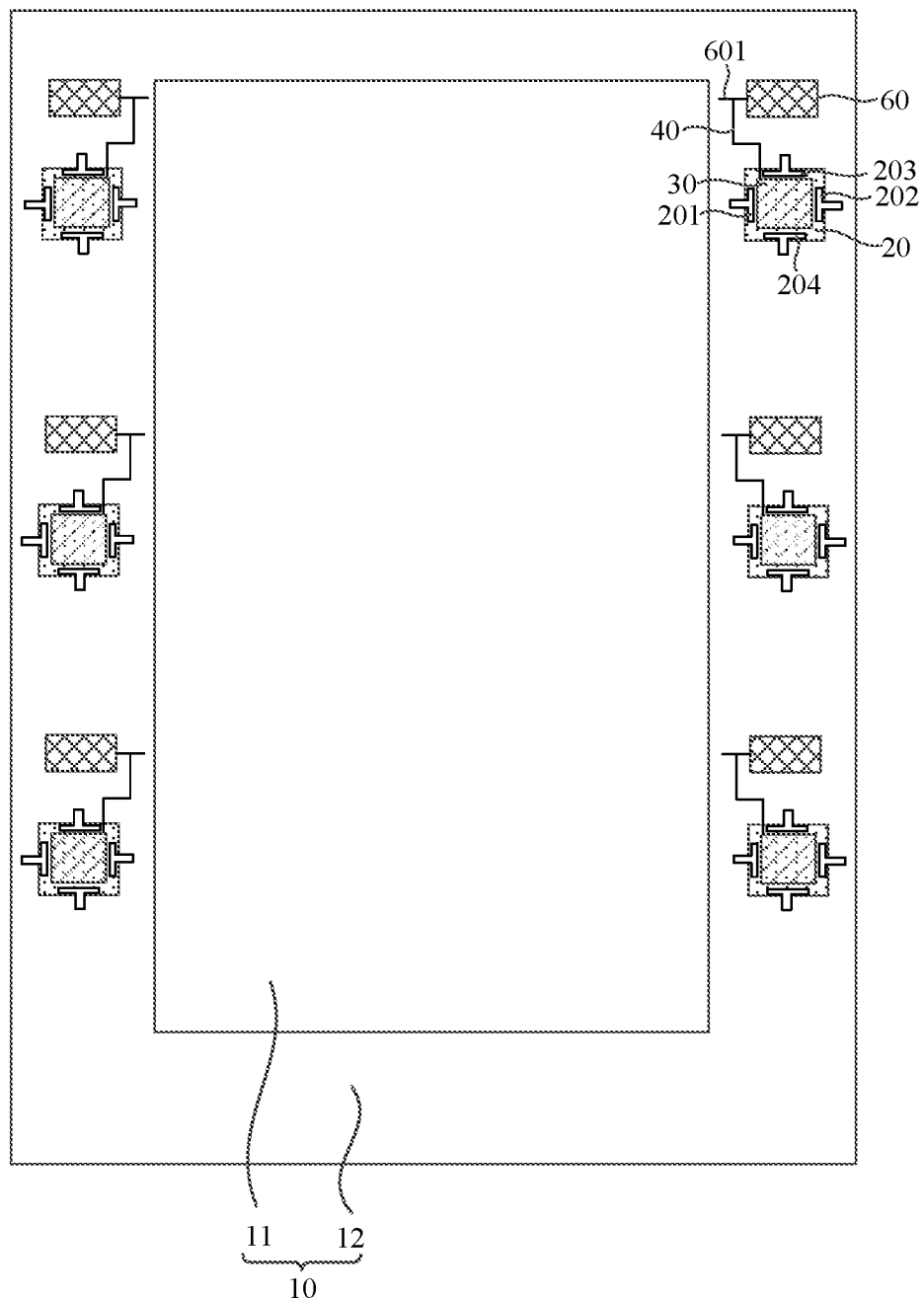
FIG. 6 is a structural diagram showing another display substrate according to an embodiment of the present disclosure.

Optionally, the display substrate according to an embodiment of the present disclosure may further include multiple cascaded shift registers disposed in the non-display region. Referring to FIG. 6, FIG. 6 is a structural diagram showing another display substrate according to an embodiment of the present disclosure. As shown in FIG. 6, each cascade of the shift registers 60 includes a scanning signal outputting terminal 601, the control signal line 40 is connected to the scanning signal outputting terminal 601 of different cascades of the shift registers 60 respectively. Optionally, the shift register 60 includes a scanning signal outputting terminal 601 to provide a scanning signal to the scanning lines during the display stage (not shown). Optionally, the control signal lines 40 which are electrically connected with the control electrode 30 may be electrically connected to the scanning signal outputting terminals 601 of different cascades of the shift registers 60, respectively, to output the scanning signal outputted from the shift registers to the control electrode 30 through the scanning signal outputting terminals 601, so as to control turning on and turning off of the semiconductor pressure sensor 20 according to the received scanning signal. It should be understood, the control signal lines 40 are electrically connect to the scanning signal outputting terminal 601 of different cascades of the shift registers 60, respectively, the scanning signal outputted from the shift registers 60 can be used as the control signal received by the control electrode 30, so that the control electrode 30 reuses the scanning signal to achieve the control of the semiconductor pressure sensor 20. Hence, not only the control method is simple but also it is not necessary to provide the control signal for the control electrode 30 using a drive circuit, thereby providing a simple and efficient design of the display substrate, and making it easier to achieve narrow frame.

Figure 7:
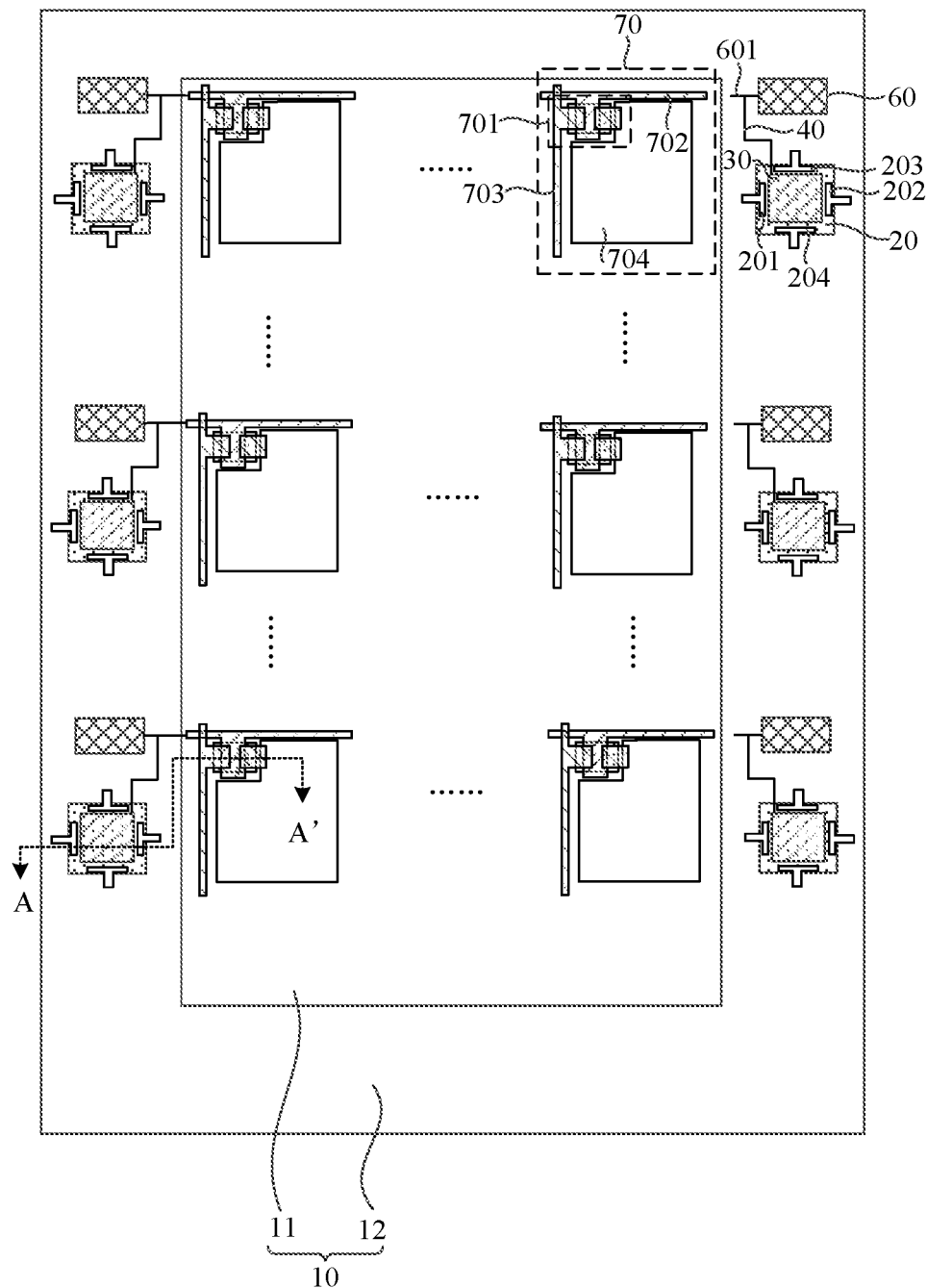
FIG. 7 is a structural diagram showing another display substrate according to an embodiment of the present disclosure.
Figure 8:
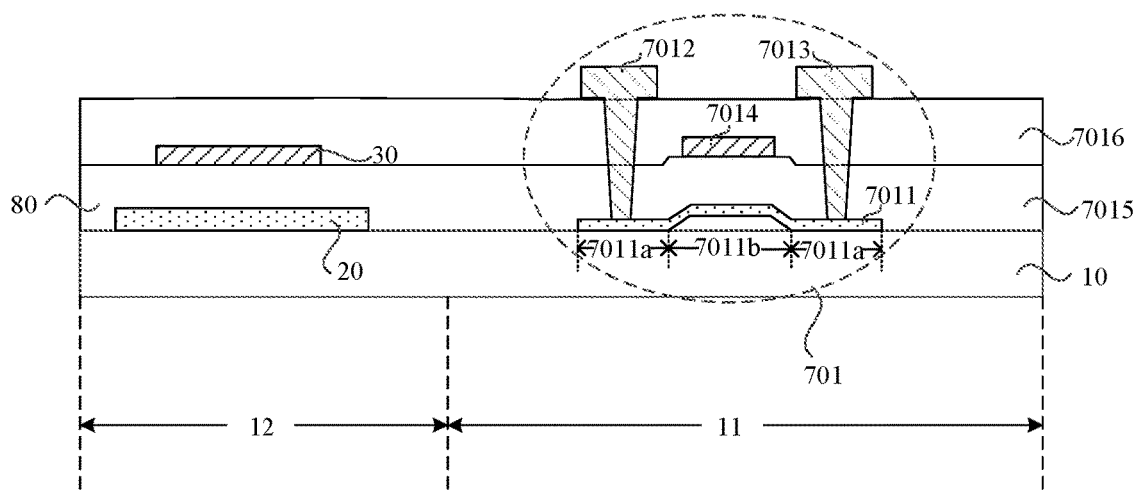
FIG. 8 is a cross sectional view of the display substrate shown in FIG. 7 along the section line A-A'.

Optionally, the display substrate according to an embodiment of the present disclosure may further include a thin film transistor 701 which may be arranged in the display region 10 and/or the non-display region 12. As shown in FIG. 7, FIG. 7 is a structural diagram showing another display substrate according to an embodiment of the present disclosure,. FIG. 7 gives an exemplary description that the thin film transistor 701 is arranged in the display region 12. It should be understood, a plurality of pixel units 70 are arranged in display region, each of the pixel units 70 is provided with a thin film transistor 701. The thin film transistor 701 is electrically connected to the scanning lines 702 and data lines 703. As a switching device, the thin film transistor 701 is used to control the display of the pixel electrode 704 connected to thereof. FIG. 8 is a cross sectional view of the display substrate in FIG. 7 along the section line A-A'. As shown in FIG. 8, the thin film transistor 701 may include an active layer 7011, the active layer 7011 is arranged at a side of the base substrate 10, the semiconductor pressure sensor 20 and the active layer 7011 are arranged at the same layer. Optionally, the material of the semiconductor pressure sensor 20 may be same with that of the active layer 7011, such as amorphous silicon film or polysilicon film. During the manufacturing process, the semiconductor pressure sensor 20 and the active layer 7011, the semiconductor pressure sensor 20 and the active layer 7011 may be manufactured in the same process.

Continue referring to FIG. 8, the active layer 7011 may include a source/drain region 7011a and a channel region 7011b. When the thin film transistor 701 is in working mode, the carrier density of the source/drain region 7011a is larger than that of channel region 7011b. Optionally, the carrier density of the semiconductor pressure sensor 20 is located between that of source/drain region 7011a and a channel region 7011b, that is, the carrier density of the semiconductor pressure sensor 20 may be larger than that of channel region 7011b and less than that of source/drain region 7011a, thereby ensuring the semiconductivity of the semiconductor pressure sensor 20, and also the relative large carrier density ensures a good performance of the conduction of the semiconductor pressure sensor 20.

Continue referring to FIG. 8, the display substrate according to an embodiment of the present disclosure may further include a dielectric layer 80 which may be arranged between the control electrode 30 and the semiconductor pressure sensor 20 and used to maintain the insulation between the control electrode 30 and the semiconductor pressure sensor 20. Optionally, the material of the dielectric layer is silica.

Continue referring to FIG. 8, the thin film transistor 701 may include a source electrode 7012, a drain electrode 7013, a gate electrode 7014, a gate electrode insulation layer 7015 and an interlamination insulation layer 7016, and the control electrode 30 may be arranged at the same layer with any one of the source electrode 7012, drain electrode 7013 and gate electrode 7014, and the dielectric layer may be arranged at the same layer with the gate electrode insulation layer 7015 or the interlamination insulation layer 7016. Exemplarily, the material of the control electrode 30 may be same with the source electrode 7012, the drain electrode 7013 or the gate electrode 7014. For example, the material of the control electrode 30 may be one or combination of the metals including Ni, Pt, Pb and Au. During process of manufacturing the control electrode 30, the source electrode 7012, the drain electrode 7013 and the gate electrode 7014, the control electrode 30 may be manufactured in the same process with one of the source electrode 7012, drain electrode 7013 or gate electrode 7014. FIG. 8 gives an exemplary description that the control electrode 30 and the gate electrode 7014 are arranged in the same layer. Optionally, the material of the dielectric layer 80 is same with the gate electrode insulation layer 7015 and the interlamination insulation layer 7016, for example, the material may be silica. During process of manufacturing the dielectric layer 80, gate electrode insulation layer 7015 and interlamination insulation layer 7016, the dielectric layer 80 may be manufactured in the same process with the gate electrode insulation layer 7015 and the interlamination insulation layer 7016. FIG. 8 gives an exemplary description that the control electrode 80 and the gate electrode insulation layer 7015 are arranged in the same layer.

Continue referring to FIG. 8, the control electrode 30 may be arranged at a side of the semiconductor pressure sensor 20 away from the base substrate, or the control electrode 30 may be arranged at a side of the semiconductor pressure sensor 20 close to the base substrate. FIG. 8 gives an exemplary description that the control electrode 30 is arranged at the side of the semiconductor pressure sensor 20 away from the base substrate 10. It should be understood, the control electrode 30 and the gate electrode 7014 may be arranged in the same layer, and the semiconductor pressure sensor 20 and the active layer 7011 may be arranged at the same layer. In the configuration that the control electrode 30 is arranged at the side of the semiconductor pressure sensor 20 away from the base substrate 10, the gate electrode 7014 is arranged at a side of the active layer 7011 away from the base substrate 10, and in this configuration, the thin film transistor is top-gate thin film transistor. In the configuration that the control electrode 30 is arranged at the side of the semiconductor pressure sensor 20 close to the base substrate 10, the gate electrode 7014 is arranged at a side of the active layer 7011 close to the base substrate 10, and in this configuration, the thin film transistor is bottom-gate thin film transistor herein.

Figure 9:
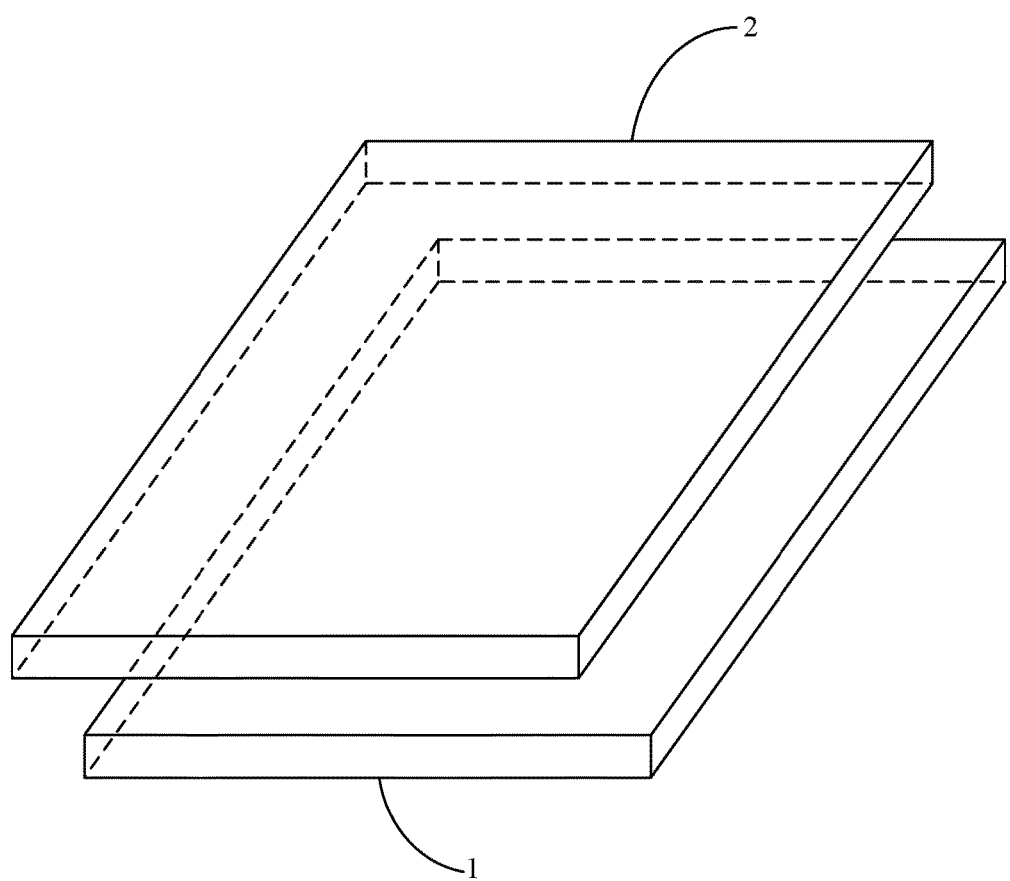
FIG. 9 is a structural diagram showing a display panel according to an embodiment of the present disclosure.

FIG. 9 is a structural diagram showing a display panel according to an embodiment of the present disclosure. Referring to FIG. 9, the display panel according to an embodiment of the present disclosure may include the display substrate 1 according to the above embodiments and an opposing substrate 2 opposite to display substrate 1, the opposing substrate 2 may be a color filter, it may also be a cover plate or other encapsulation layers.

Figure 10:
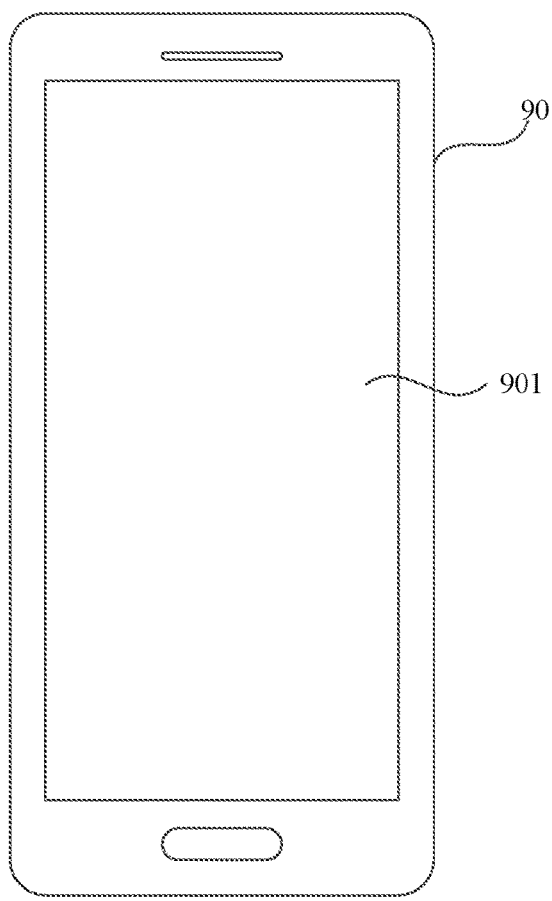
FIG. 10 is a structural diagram showing a display device according to an embodiment of the present disclosure.

FIG. 10 is a structural diagram showing a display device according to an embodiment of the present disclosure. Referring to FIG. 10, the display device may include any one of the display panel 901 according to an embodiment of the present disclosure. The display device may be a mobile phone as shown in FIG. 10, it may also be a computer, a TV, a wearable device and so on, which is not limited in the embodiments of the present disclosure.

It should be noted that the above contents are only preferred embodiments of the present disclosure and its technical principles. It can be understood for those skilled in the art that the present disclosure is not limited to specific embodiments described herein. For those skilled in the art, the present disclosure can be subject to various apparent variations, readjustments and replacements without departing from a protection scope of the present disclosure. Therefore, although the present disclosure is described in detail through above embodiments, the present disclosure is not only limited to above embodiments. The present disclosure can also include other equivalent embodiments without deviating from conceptions of the present disclosure. A scope of the present disclosure is determined by a scope of attached claims.

What is claimed is:
1. A display substrate, comprising:
   a base substrate and at least a semiconductor pressure sensor disposed in the base substrate, wherein the semiconductor pressure sensor comprises a first connection terminal, a second connection terminal, a third connection terminal and a fourth connection terminal, wherein the first and second connection terminals are configured to receive a bias voltage signal, the third and fourth connection terminals are configured to output a strain voltage signal, and a first line between the first and the second connection terminals is intersected with a second line between the third and the fourth connection terminals;
   a control electrode disposed at a side of the semiconductor pressure sensor, wherein the control electrode are configured to be insulated with the semiconductor pressure sensor, wherein the vertical projection of the control electrode on the plane of the semiconductor pressure sensor lied is overlapped with the semiconductor pressure sensor, and wherein the control electrode is configured to control the semiconductor pressure sensor to be turned on and off; and
   a control signal line connected to the control electrode.
2. The display substrate according to claim 1, wherein the control electrode is a metallic electrode.
3. The display substrate according to claim 1, further comprising:
   a thin film transistor, wherein the thin film transistor comprises an active layer, wherein
   the semiconductor pressure sensor and the active layer are disposed in the same layer.
4. The display substrate according to claim 3, wherein the active layer comprises a source/drain region and a channel region;
   wherein a carrier density of the semiconductor pressure sensor is larger than that of the channel region and less than that of the source/drain region.

5. The display substrate according to claim 3, further comprising:
a dielectric layer, wherein the dielectric layer is arranged between the control electrode and the semiconductor pressure sensor, and is configured to maintain the insulation between the control electrode and the semiconductor pressure sensor.

6. The display substrate according to claim 5, wherein the thin film transistor further comprises a source electrode, a drain electrode, a gate electrode, a gate electrode insulation layer and an interlamination insulation layer, wherein the control electrode is disposed in the same layer with one of the source electrode, drain electrode and gate electrode, and the dielectric layer is disposed in the same layer with one of the gate electrode insulation layer and the interlamination insulation layer.

7. The display substrate according to claim 1, wherein the control electrode is disposed at a side of the semiconductor pressure sensor away from the base substrate or a side of the semiconductor pressure sensor close to the base substrate.

8. The display substrate according to claim 3, wherein the display substrate comprises a display region and a non-display region surrounding the display region, wherein the semiconductor pressure sensor is disposed in the non-display region, and the thin film transistor is disposed in at least one of the display region and the non-display region.

9. The display substrate according to claim 8, further comprising:
multiple cascaded shift registers arranged in the non-display region, each cascade of the shift registers comprises a scanning signal outputting terminal, and the control signal lines are connected to the scanning signal outputting terminals of different cascades of the shift registers, respectively.

10. The display substrate according to claim 1, further comprising:
a bias voltage applying circuit and a voltage detection circuit, wherein
the bias voltage applying circuit is electrically connected to the first and second connection terminals of the semiconductor pressure sensor, to provide the bias voltage signal to the semiconductor pressure sensor;
the voltage detection circuit is electrically connected to the third and fourth connection terminals of the semiconductor pressure sensor, to receive the strain voltage signal from the semiconductor pressure sensor.

11. The display substrate according to claim 8, wherein the display substrate comprises a plurality of the semiconductor pressure sensors which are arranged in a column in each of the left and right side of the display region; and
among the semiconductor pressure sensors in the same column, each of the first connection terminals is electrically connected to a first signal line, each of the second connection terminals is electrically connected to a second signal line, each of the third connection terminals is electrically connected to a third signal line, and each of the fourth connection terminals is electrically connected to a fourth signal line.

12. The display substrate according to claim 1, wherein the first line is intersected orthogonally with the second line.

13. The display substrate according to claim 1, wherein the semiconductor pressure sensor comprises a polygon structure with at least four sides, wherein the first, second, third and fourth connection terminals are arranged in the location of the polygon structure which are close to four sides, respectively;
the vertical projection of the control electrode on the plane of the semiconductor pressure sensor lied is overlapped with the part of the semiconductor pressure sensor other than the first, second, third and fourth connection terminals.

14. The display substrate according to claim 13, wherein the shape of the semiconductor pressure sensor is a rectangle, and the shape of the control electrode is a rectangle.

15. The display substrate according to claim 1, wherein the semiconductor pressure sensor comprises a body portion of a polygon structure with at least four sides and at least four protrusions connected to the body portion, wherein the first, second, third and fourth connection terminals are disposed on the protrusions, respectively;
the vertical projection of the control electrode on the plane of the semiconductor pressure sensor is overlapped with one of the body portion and the protrusion.

16. The display substrate according to claim 15, wherein the shape of the body portion is a rectangle, and the shape of the control electrode is also a rectangle.

17. The display substrate according to claim 1, wherein the semiconductor pressure sensor comprises a hollow zone.

18. The display substrate according to claim 1, wherein the semiconductor pressure sensor is an amorphous silicon film or a polysilicon film.

19. A display panel, comprising a display substrate, wherein the display substrate comprises:
a base substrate and at least a semiconductor pressure sensor disposed in the base substrate, wherein the semiconductor pressure sensor comprises a first connection terminal, a second connection terminal, a third connection terminal and a fourth connection terminal, wherein the first and second connection terminals are configured to receive a bias voltage signal, the third and fourth connection terminals are configured to output a strain voltage signal, and a first line between the first and the second connection terminals is intersected with a second line between the third and the fourth connection terminals;
a control electrode disposed at a side of the semiconductor pressure sensor, wherein the control electrode are configured to be insulated with the semiconductor pressure sensor, wherein the vertical projection of the control electrode on the plane of the semiconductor pressure sensor lied is overlapped with the semiconductor pressure sensor, and wherein the control electrode is configured to control the semiconductor pressure sensor to be turned on and off; and
a control signal line connected to the control electrode.

20. A display device, comprising a display panel, the display panel comprising a display substrate, wherein the display substrate comprising:
a base substrate and at least a semiconductor pressure sensor disposed in the base substrate, wherein the semiconductor pressure sensor comprises a first connection terminal, a second connection terminal, a third connection terminal and a fourth connection terminal, wherein the first and second connection terminals are configured to receive a bias voltage signal, the third and fourth connection terminals are configured to output a strain voltage signal, and a first line between the first and the second connection terminals is intersected with a second line between the third and the fourth connection terminals;

a control electrode disposed at a side of the semiconductor pressure sensor, wherein the control electrode are configured to be insulated with the semiconductor pressure sensor, wherein the vertical projection of the control electrode on the plane of the semiconductor pressure sensor lied is overlapped with the semiconductor pressure sensor, and wherein the control electrode is configured to control the semiconductor pressure sensor to be turned on and off; and a control signal line connected to the control electrode.

* * * * *